(12) United States Patent
Hong et al.

(10) Patent No.: US 9,502,274 B2
(45) Date of Patent: Nov. 22, 2016

(54) WAFER LOADERS HAVING BUFFER ZONES

(71) Applicant: Samsung Electronics Co., Ltd., Suwon-si, Gyeonggi-do (KR)

(72) Inventors: Yi Koan Hong, Suwon-si (KR); Byung Lyul Park, Seoul (KR); Jumyong Park, Yongin-si (KR); Jisoon Park, Suwon-si (KR); Kyu-Ha Lee, Yongin-si (KR); Siyoung Choi, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/281,880

(22) Filed: May 19, 2014

(65) Prior Publication Data

US 2015/0068948 A1 Mar. 12, 2015

(30) Foreign Application Priority Data

Sep. 11, 2013 (KR) .......................... 10-2013-0109201

(51) Int. Cl.
*H01L 21/673* (2006.01)

(52) U.S. Cl.
CPC ....... *H01L 21/6733* (2013.01); *H01L 21/6732* (2013.01); *H01L 21/67323* (2013.01); *H01L 21/67326* (2013.01)

(58) Field of Classification Search
CPC ............. H01L 21/673; H01L 21/6732; H01L 21/67326; H01L 21/67383; H01L 21/67369; H01L 21/67313; B65D 25/103; B65D 25/107; Y10S 206/832; Y10S 414/138
See application file for complete search history.

(56) References Cited

U.S. PATENT DOCUMENTS

| | | | |
|---|---|---|---|
| 4,566,839 A * | 1/1986 | Butler | ............... H01L 21/67313 118/500 |
| 4,573,851 A | 3/1986 | Butler | |
| 4,653,636 A * | 3/1987 | Armstrong | ............. B05C 13/02 118/500 |
| 4,724,963 A | 2/1988 | Mortensen | |
| 5,062,526 A * | 11/1991 | Rudnick | ................... A47F 7/02 206/486 |
| 6,145,673 A | 11/2000 | Burrows et al. | |
| 6,206,197 B1 * | 3/2001 | Decamps | ............ H01L 21/6732 206/454 |
| 6,318,389 B1 * | 11/2001 | Schmidt | ............ H01L 21/67313 118/500 |
| 6,595,841 B2 | 7/2003 | Lai et al. | |
| 7,677,394 B2 | 3/2010 | Conarro | |
| 8,008,941 B2 | 8/2011 | Schmidt et al. | |
| 8,196,748 B2 | 6/2012 | Chiu et al. | |
| 8,268,448 B2 | 9/2012 | Boyle et al. | |

(Continued)

FOREIGN PATENT DOCUMENTS

| JP | 2000038218 A | 2/2000 |
|---|---|---|
| JP | 2008021929 A | 1/2008 |

(Continued)

*Primary Examiner* — Andrew Perreault
(74) *Attorney, Agent, or Firm* — Renaissance IP Law Group LLP

(57) ABSTRACT

Embodiments of the present inventive concepts provide a wafer loader having one or more buffer zones to prevent damage to a wafer loaded in the wafer loader. The wafer loader may include a plurality of loading sections that protrude from a main body and are configured to be arranged at various locations along an edge of the wafer. Each of the loading sections may include a groove into which the edge of the wafer may be inserted. The loading section may include first and second protrusions having first and second inner sides, respectively, that face each other to define the groove therebetween. At least one of the first and second inner sides may include a recess to define the buffer zone.

6 Claims, 29 Drawing Sheets

(56) References Cited

U.S. PATENT DOCUMENTS

| | | | |
|---|---|---|---|
| 8,307,997 B2* | 11/2012 | Jonas | H01L 21/67313 211/41.18 |
| 2002/0114686 A1 | 8/2002 | Glynn et al. | |
| 2003/0119434 A1 | 6/2003 | Lai et al. | |
| 2004/0134828 A1 | 7/2004 | Conarro | |
| 2007/0125726 A1* | 6/2007 | Seo | H01L 21/67028 211/41.18 |
| 2008/0157455 A1* | 7/2008 | Lester | H01L 21/67326 269/287 |
| 2009/0305617 A1 | 12/2009 | Nakamura et al. | |
| 2010/0119817 A1 | 5/2010 | Boyle et al. | |
| 2010/0327900 A1 | 12/2010 | Schmidt et al. | |
| 2011/0266192 A1 | 11/2011 | Chiu et al. | |

FOREIGN PATENT DOCUMENTS

| | | |
|---|---|---|
| JP | 4153273 B2 | 9/2008 |
| KR | 19980076785 | 11/1998 |
| KR | 20060103762 A | 10/2006 |

* cited by examiner

WAFER LOADERS HAVING BUFFER ZONES

CROSS-REFERENCE TO RELATED APPLICATIONS

This U.S. nonprovisional patent application claims priority under 35 U.S.C. §119 from Korean Patent Application 10-2013-0109201 filed on Sep. 11, 2003, the contents of which are hereby incorporated by reference in their entirety.

BACKGROUND

The present inventive concepts relate to wafer loaders and, more particularly, to wafer loaders having one or more buffer zones.

In a semiconductor manufacturing process, processes such as a photolithography process, an etch process, a diffusion process, and so forth, may be repeatedly performed on a wafer. While performing these processes, damage and impact to the wafer should be prevented so as to permit the diverse processes to be satisfactorily performed. If the wafer suffers damage or shock as the wafer is loaded on a wafer loader, yield drops and additional processes may be needed to cure the damaged wafer. Thus, the industry would be benefited by a wafer loader capable of stably loading a single wafer or a bonded wafer into the wafer loader without damage to the wafer.

SUMMARY

Embodiments of the present inventive concepts provide a wafer loader having a buffer zone in which a wafer is loaded without mechanical contact or friction.

Embodiments of the present inventive concepts provide a wafer loader having a buffer zone capable of safely loading more than one single wafer or bonded wafer to which a carrier is attached.

Embodiments of the present inventive concepts provide a wafer loader having a buffer zone optimized for loading a bonded wafer to which a carrier is attached.

According to exemplary embodiments of the present inventive concepts, a wafer loader may comprise a plurality of loading sections that protrude from a main body and are arranged along an edge of wafer. Each of the loading sections has a groove into which the edge of wafer is inserted. First and second protrusions, having first and second inner sides, respectively, face each other to define the groove. One of the first and second inner sides may be at least partially recessed to define a buffer zone.

In some embodiments, a buffer zone recess may have a concave shape.

In some embodiments, the recessed one of the first and second inner sides may comprise an additional recess to define an additional buffer zone. The additional recess may have a concave shape.

In some embodiments, the loading section may further comprise a liner arranged on one or both of the first and second inner sides.

In some embodiments, the liner be arranged only on the non-recessed side, or the liner may extend onto the recessed side.

In some embodiments, the loading section may further comprise a fixing member that supports the edge of wafer which is inserted into the groove. The fixing member may protrude from a part of the main body that constitutes a floor or bottom of the groove.

In some embodiments, the loading section may further comprise a first aperture extending through one of the first and second protrusions that is configured to hold the wafer onto said one of the first and second protrusions, and/or a second aperture extending through one of the first and second protrusions and configured to discharge a liquid material from the wafer to an outside of the groove.

In some embodiments, at least one of the first and second inner sides may extend away from the main body at a slant.

In some embodiments, one of the first and second protrusions may protrude substantially vertically from the main body, and the other of the first and second protrusions may protrude from the main body at a slant.

In some embodiments, the groove may have a lateral width that decreases as a distance from the main body decreases.

According to exemplary embodiments of the present inventive concepts, a wafer loader may comprise a main body having a groove configured to receive a wafer. The main body may comprise first and second protrusions that protrude from the main body so as to define the groove. The first and second protrusions may include first and second inner sides, respectively, that face each other, wherein the first inner side of the first protrusion is configured to contact one edge surface of the wafer, and wherein the second inner side of the second protrusion is recessed to define a first buffer zone configured to keeps the opposite edge surface of the wafer spaced apart from the second inner side.

In some embodiments, the first protrusion may extend substantially vertically from the main body and the second protrusion may protrude from the main body at a slant. The groove may have a width that increases with a distance from the main body.

In some embodiments, a wafer loader may further comprise a liner substantially covering the first inner side, so as to provide a cushion between the first protrusion and an edge surface of the wafer, the liner being formed of a material softer than that of the main body.

In some embodiments, the first and second protrusions may constitute a loading section that receives an edge of the wafer. The wafer loader may comprise a plurality of loading sections arranged along the edge of the wafer.

In some embodiments, the first inner side of the first protrusion may include a recess to define a second buffer zone that keeps an edge surface of the wafer spaced apart from the first inner side.

BRIEF DESCRIPTION OF THE DRAWINGS

The accompanying drawings are included to provide a further understanding of the inventive concepts, and are incorporated in and constitute a part of this specification. The drawings illustrate example embodiments of the present inventive concepts and, together with the description, serve to explain principles of the present inventive concepts. In the drawings.

DETAILED DESCRIPTION OF PREFERRED EMBODIMENTS

Preferred embodiments of the present inventive concepts will be described below in more detail with reference to the accompanying drawings. The present inventive concepts may, however, be embodied in different forms and should not be construed as being limited to the particular embodiments set forth herein. Rather, these embodiments are provided so that this disclosure will be thorough and complete, and will fully convey the scope of the inventive concepts to those skilled in the art. Like numerals refer to like elements throughout the specification.

Figure 1:
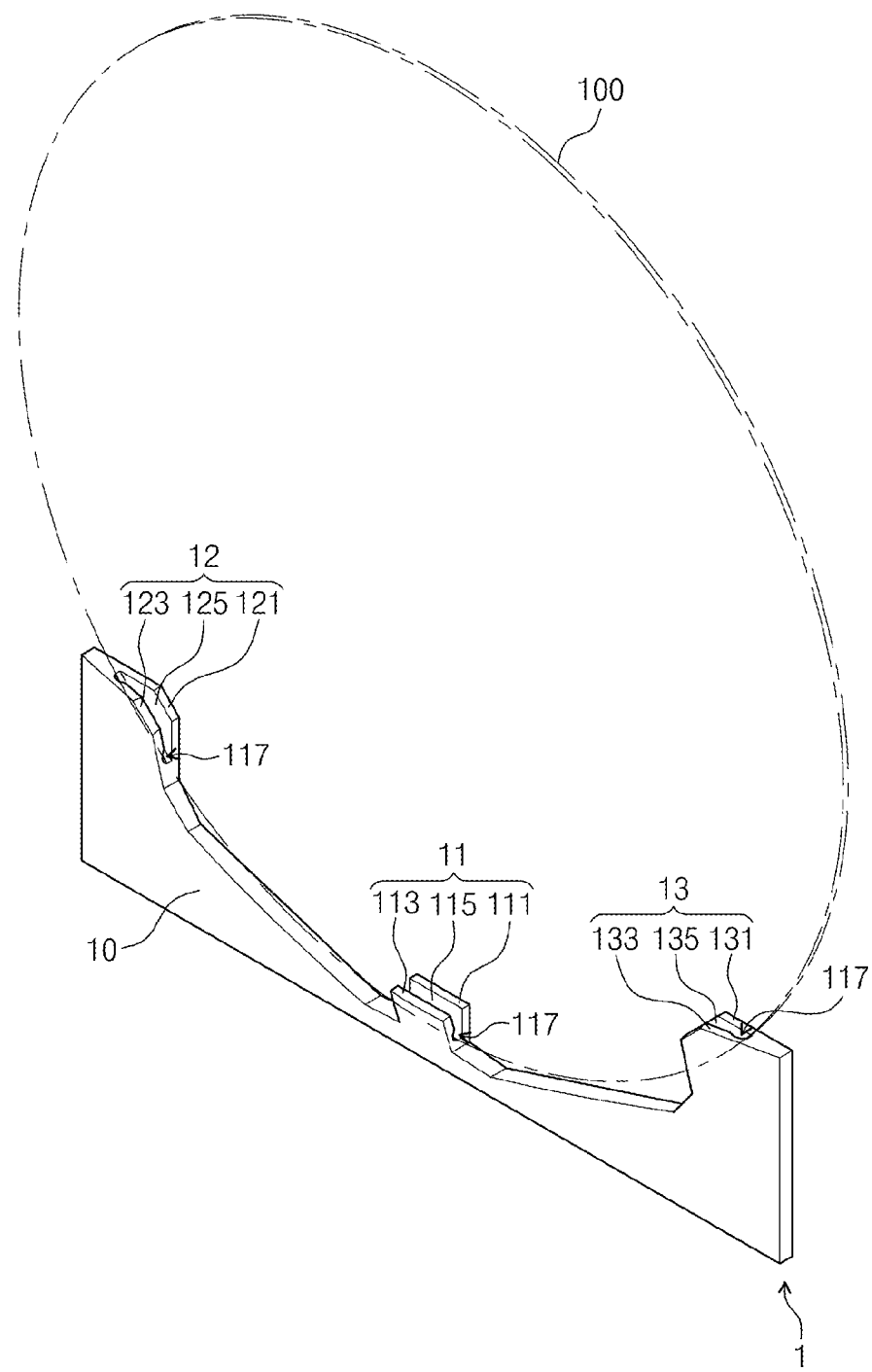
FIG. 1 is a perspective view of a wafer loader constructed according to an exemplary embodiment of the present inventive concepts.

FIG. 1 is a perspective view of a wafer loader according to an exemplary embodiment of the present inventive concepts.

Referring to FIG. 1, a wafer loader 1 may comprise a main body 10 and a plurality of loading sections 11, 12 and 13 that protrude from the main body 10. The loading sections 11, 12 and 13 may comprise grooves 115, 125 and 135, respectively, each having a substantially V-shape configuration suitable for receiving a wafer 100.

The loading sections 11, 12 and 13 may be arranged along an edge of the wafer 100. For example, the loading sections 11, 12 and 13 may comprise a first loading section 11 provided at a location corresponding to about the 6 o'clock position of the wafer 100, a second loading section 12 disposed at a location corresponding to about the 8 o'clock position of the wafer 100, and a third loading section 13 located at a position corresponding to about the 4 o'clock position of the wafer 100.

The first loading section 11 may comprise two protrusions 111 and 113 that branch out in an approximately V-shape to form a first groove 115. Similarly, the second loading section 12 may comprise two protrusions 121 and 123 that branch out in a substantially V-shape to form a second groove 125. Likewise, the third loading section 13 may comprise two protrusions 131 and 133 that branch out in a substantially V-shape to form a third groove 135.

The number and positions of the loading sections need not be limited to that of this embodiment, but can be modified in number, arrangement, and position, as desired. The first to third loading sections 11 to 13 may be integrally formed with the main body 10 to constitute a single, unitary structure.

The wafer loader 1 may comprise any desired material. For example, the wafer loader 1 may comprise a stiff material such as metal, glass, polymer, or carbon fiber. According to some embodiments, the wafer loader 1 may comprise a polymer, such as polyvinyl chloride (PVC), polypropylene (PP), polyethylene (PE), polyetheretherketone (PEEK), polyetherketoneketone (PEKK), or any combination thereof. The wafer loader 1 may load the wafer 100 in a substantially vertical state.

The first loading section 11 may comprise a buffer zone 117, configured to prevent damage to the wafer 100, as described below with reference to FIG. 2A. Similar buffer zones 117 may be also included in the second and third loading sections 12, 13, respectively. Although the present description is directed toward the first loading section 11, this description is also applicable to the second and third loading sections 12, 13, and redundant descriptions thereof will therefore be omitted.

Figure 2A:
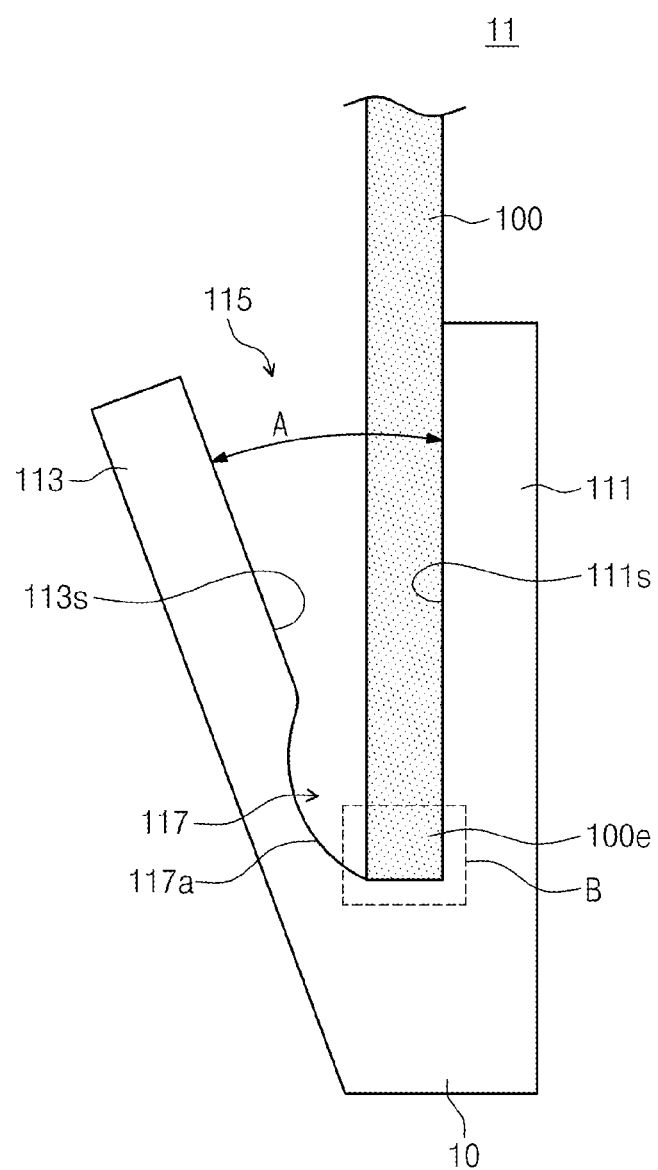
FIG. 2A is a cross-sectional view of the wafer loader of FIG. 1, having a single wafer loaded therein according to an exemplary embodiment of the present inventive concepts.
Figure 2B:
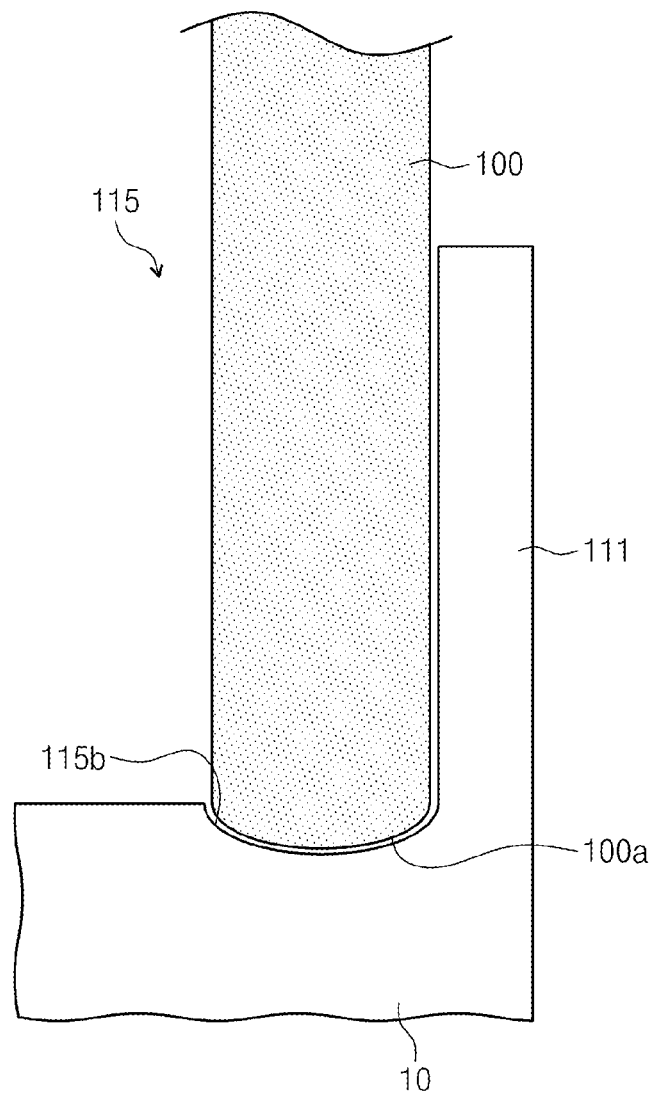
FIG. 2B is an enlarged view of a portion B of FIG. 2A.
Figure 2C:
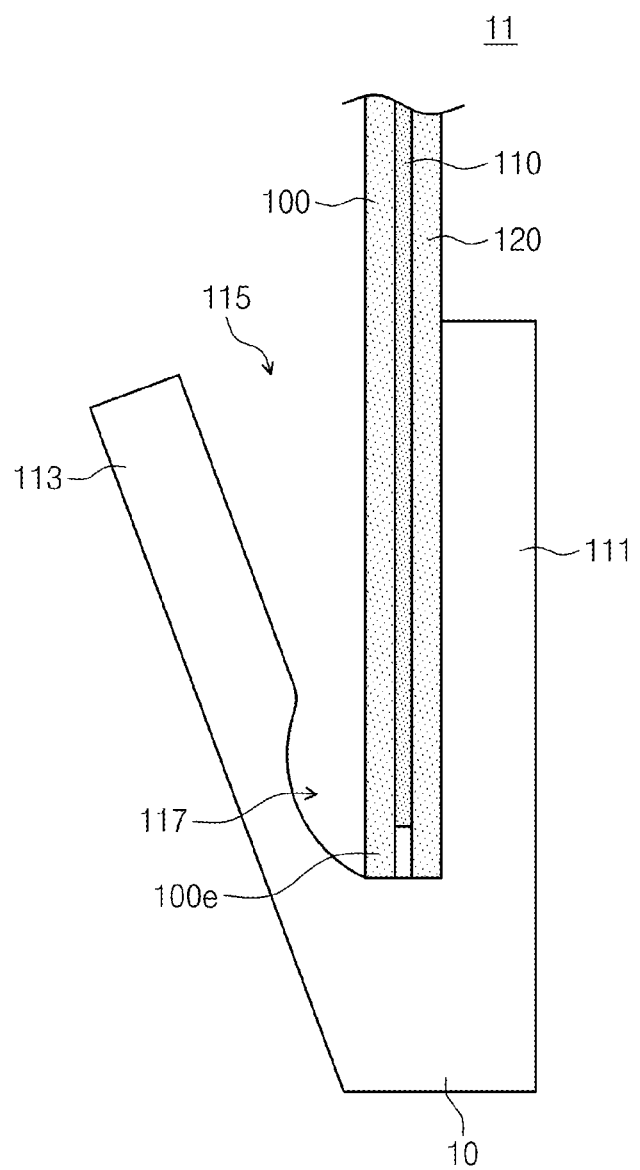
FIG. 2C is a cross-sectional view of the wafer loader of FIG. 1, having a bonded wafer loaded thereon according to an exemplary embodiment of the present inventive concepts.

The wafer 100 may, for instance, comprise a single wafer on which devices are formed (as illustrated in FIG. 2A), or a bonded wafer to which a carrier is attached (as illustrated in FIG. 2C).

Figure 3A:
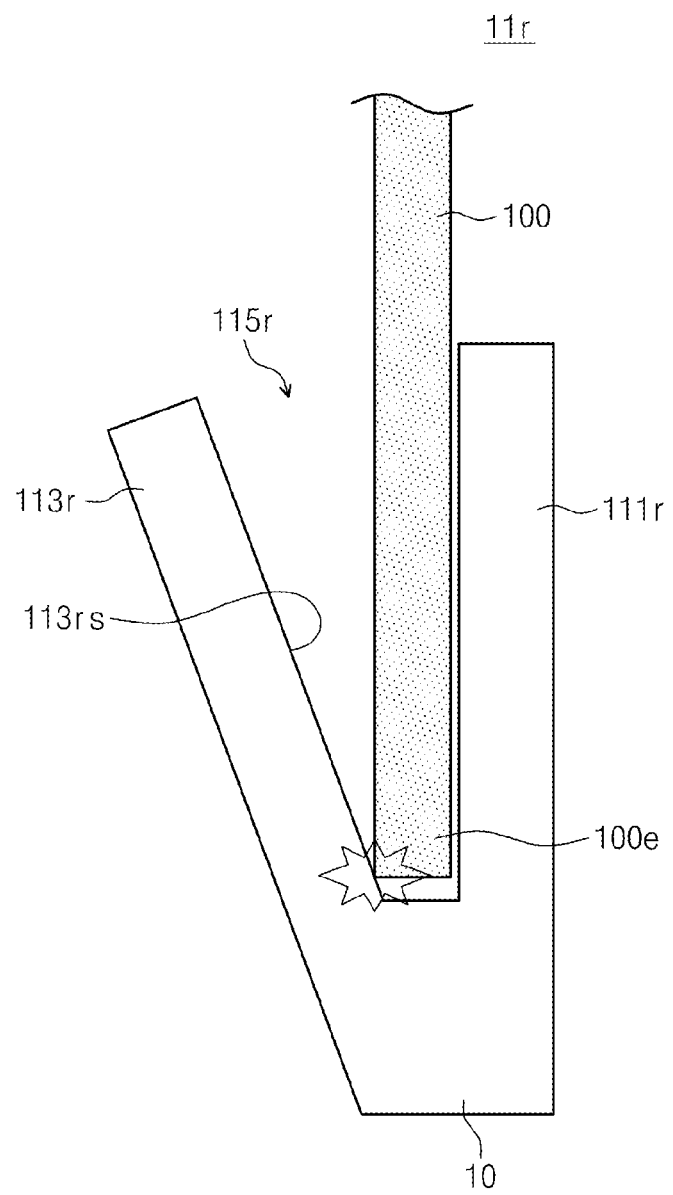
FIGS. 3A and 3B are cross-sectional views of a wafer loader for comparison with a wafer loader according to exemplary embodiments of the present inventive concepts.
Figure 3B:
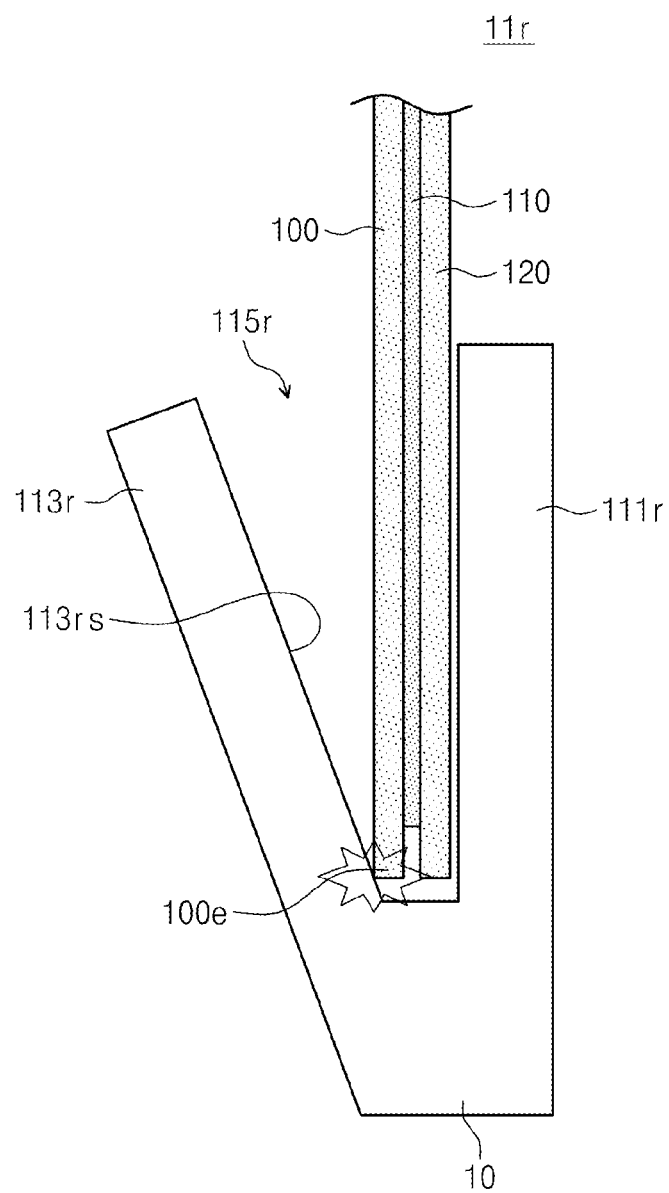

FIG. 2A is a cross-sectional view of the wafer loader 1 of FIG. 1, illustrating an example in which a single wafer is loaded into the wafer loader 1 according to an exemplary embodiment of the present inventive concepts. FIG. 2B is an enlarged view of a portion B of FIG. 2A. FIG. 2C is a cross-sectional view of the wafer loader 1 of FIG. 1, illustrating an example in which a bonded wafer is loaded into the wafer loader 1 according to another exemplary embodiment of the present inventive concepts. FIGS. 3A and 3B are cross-sectional views illustrating another wafer loader, and are provided for comparison with the wafer loader according to exemplary embodiments of the present inventive concepts.

Referring to FIG. 2A, the first loading section 11 may comprise a first protrusion 111, a second protrusion 113, and a first groove 115 arranged between the first and second protrusions 111 and 113. A wafer 100 may be inserted into the first groove 115. The first protrusion 111 may extend substantially vertically from the main body 10, while the second protrusion 113 may protrude from the main body 10 at a predetermined angle A, or in other words, at a slant. For example, the second protrusion 113 may be slanted away from the first protrusion 111 at an angle A of about 90° or less (e.g., preferably about 30°). The first protrusion 111 may extend away from the main body 10 with a length that is identical to, or similar to, that of the second protrusion 113. The first groove 115 may be defined by a gap between inner sides of the first and second protrusions 111 and 113. The first groove 115 may have a substantially V-shape, wherein a floor of the first groove 115 is relatively narrow and an entrance of the first groove 115 is relatively wide. The wide entrance of the first groove 115 may readily facilitate insertion of the wafer 100 into the first groove 115. In some embodiments, the first loading section 11 may comprise a buffer zone 117 that spatially isolates a bottom portion of the wafer 100 from the second protrusion 113, thereby preventing the wafer 100 from directly contacting the second protrusion 113.

Referring to FIG. 2B, a floor surface 115b of the first groove 115 may have a shape that coincides with a bottom edge surface 100a of the wafer 100. For example, the floor surface 115b may have a concave shape if the bottom edge surface 100a of the wafer 100 has a convex shape.

Referring back to FIG. 2A, the first groove 115 may receive the wafer 100 therein to load the wafer 100 into the first wafer loader 1 with the wafer 100 in contact with a first inner side 111s of the first protrusion 111 or a second inner side 113s of the second protrusion 113. The first inner side 111s may extend substantially vertically from the main body 10. The second inner side 113s may include a recess or recessed area 117a that defines a buffer zone 117. The recess 117a may have a concave shape such that the buffer zone 117 has an oval shape or a hemispherical shape. When the wafer 100 is inserted into the first groove 115, the buffer zone 117 may prevent an edge 100e of the wafer 100 from directly contacting the second protrusion 113.

Unlike the exemplary embodiment described above, in a wafer loader, as illustrated in FIG. 3A, a loading section 11r may have a V-shaped groove 115r between a first protrusion 111r and a second protrusion 113r without a buffer zone arranged therein. When the wafer 100 is inserted into the groove 115r, the edge 100e of the wafer 100 may contact a second inner side 113rs of the second protrusion 113r. Contact between the wafer edge 100e and the inner side 113rs may induce scratches in and/or damage to the edge 100e of the wafer 100, or may generate particles from the wafer 100 and/or the second protrusion 113r. According to embodiments incorporating the principles of the inventive concepts, as illustrated in FIG. 2A for example, the buffer zone 117 may prevent the edge 100e of the wafer 100 from contacting the second inner side 113s, thereby eliminating or reducing scratches, damage and/or particles.

Referring to FIG. 2C, in an alternative application, a carrier 120 may be attached onto the wafer 100 using an adhesive layer 110 to facilitate easy handling of the wafer 100, such as when thinning the wafer 100 using a chemical mechanical polishing process or a grinding process. For example, a backside of the wafer 100 may need to be polished to expose one or more through electrodes formed therein. In this case, the backside of the wafer 100 may be polished after the carrier 120 is attached to a front side of the wafer 100. The carrier 120 may, for example, be a glass substrate or a silicon wafer identical or similar to the wafer 100. The wafer 100 coupled with the carrier 120 may be collectively referred to herein as a bonded wafer.

When the bonded wafer 100 is loaded on the first loading section 11, the wafer 100 may face the second protrusion 113 and the carrier 120 may face the first protrusion 111, or vice versa. As illustrated in FIG. 3B, when the bonded wafer 100 is inserted into the groove 115r of the loading section 11r without a buffer zone, the edge 100e of the bonded wafer 100 may suffer from mechanical stress or physical damage due to direct contact between the bonded wafer 100 and the second inner side 113rs. In particular, the edge 100e of the bonded wafer 100 may suffer severely as a result of the mechanical stress, especially when the adhesive layer 110 does not fully cover the edge 100e of the wafer 100. According to some embodiments incorporating principles of the present inventive concepts, as illustrated in FIG. 2C for example, the buffer zone 117 may prevent the edge 100e of the bonded wafer 100 from contacting the second inner side 113s, such that the edge 100e of the wafer 100 may be free from mechanical stress when inserted into the wafer loader 1.

FIGS. 4A to 4K are cross-sectional views of wafer loaders illustrating modified examples of the wafer loader 1 shown in FIG. 2A.

Figure 4A:
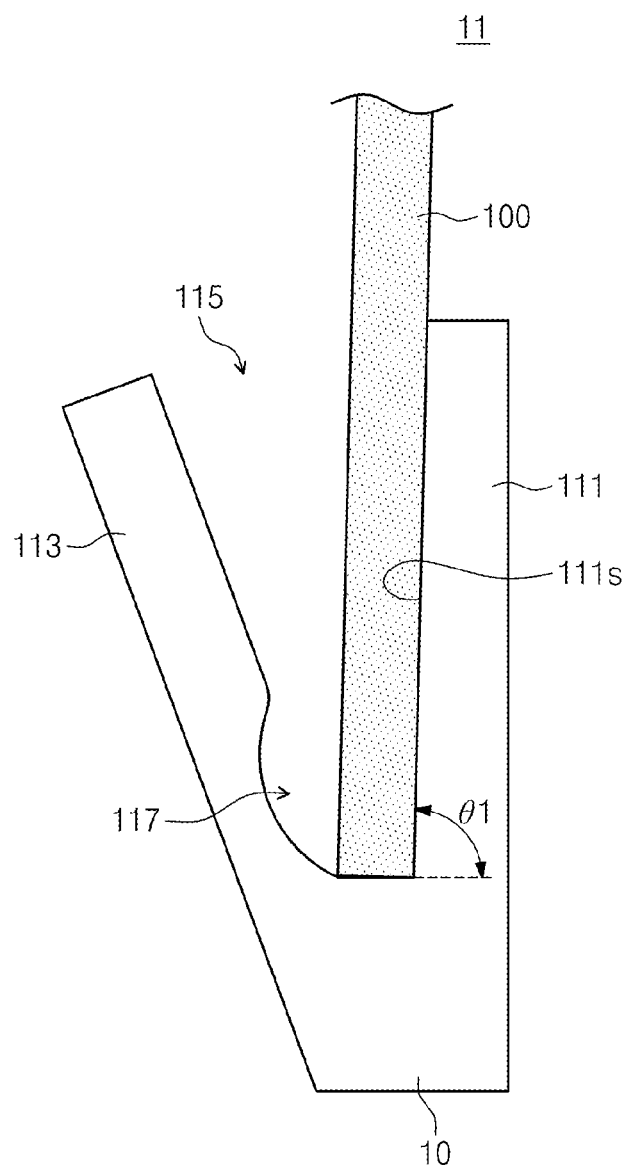
FIGS. 4A to 4K are cross-sectional views of a wafer loader according to principles of the present inventive concepts, illustrating various possible modifications to the embodiment shown in FIG. 2A.

Referring to FIG. 4A, the first loading section 11 may be configured to slantingly load the wafer 100 into the wafer loader 1. For example, the first inner side 111s may extend from the main body 10 at a slanted angle to have an upward slope. A first tilt angle θ1 of the first inner side 111s may be less than about 90°, for example, between about 80° to about 90°. In some embodiments, the first tilt angle θ1 may be about 85°. The wafer 100 may thereby be slantingly loaded against the first protrusion 111 due to the angle of inclination of the first inner side 111s.

Figure 4B:
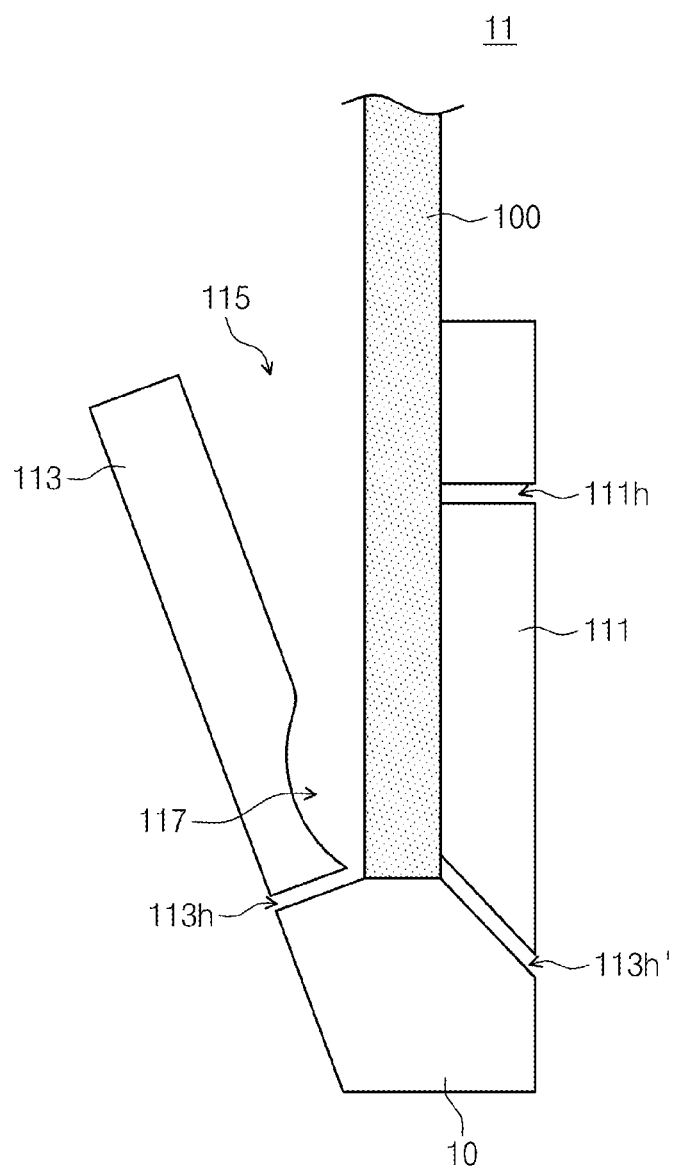

Referring to FIG. 4B, the first loading section 11 may be configured to hold the wafer 100 inserted into the groove 115. For example, the first protrusion 111 may comprise a vacuum aperture 111h that substantially horizontally penetrates the first protrusion 111. The first loading section 11 may be further configured to exhaust a liquid material. For example, the first and/or second protrusion 111, 113 may comprise an exhaust aperture 113h, 113h' that penetrates a bottom portion of the protrusion, adjacent to a boundary between the first and/or second protrusion 111, 113 and the main body 10. The exhaust aperture 113h may naturally discharge a liquid material (e.g., etchant, cleaning solution, and/or water from the wafer 100) by gravity.

Figure 4C:
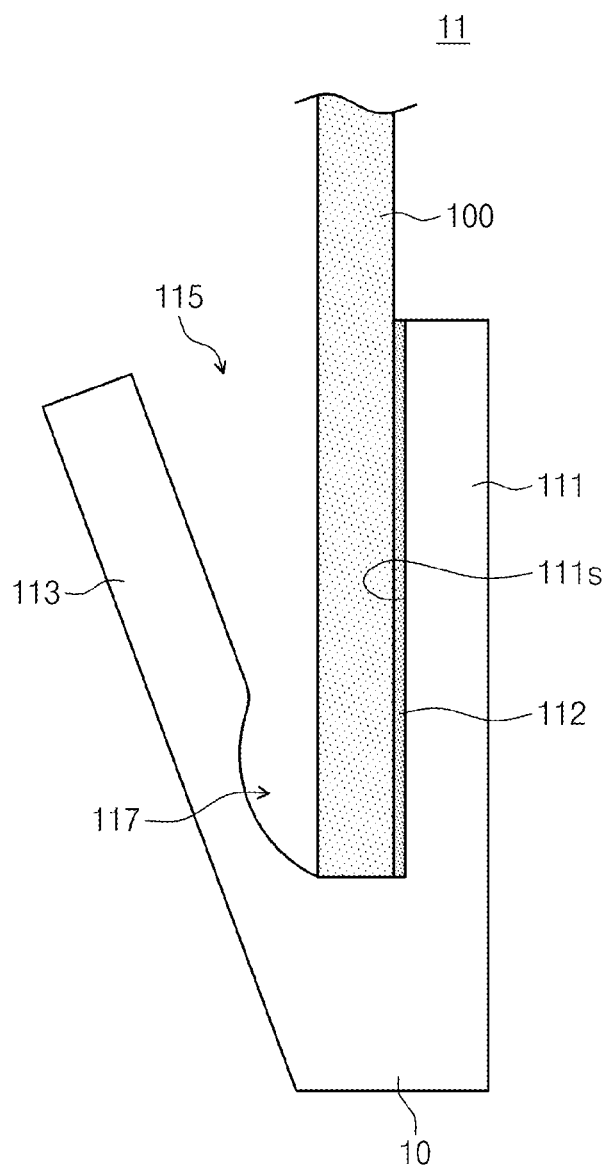

Referring to FIG. 4C, the first loading section 11 may further comprise a liner 112 arranged on the first inner side 111s. The liner 112 may comprise a material softer than that of the main body 10. The liner 112 may reduce impact and/or friction between the first protrusion 111 and the wafer 100 such that the first loading section 11 may load the wafer 100 without damage thereto.

Figure 4D:
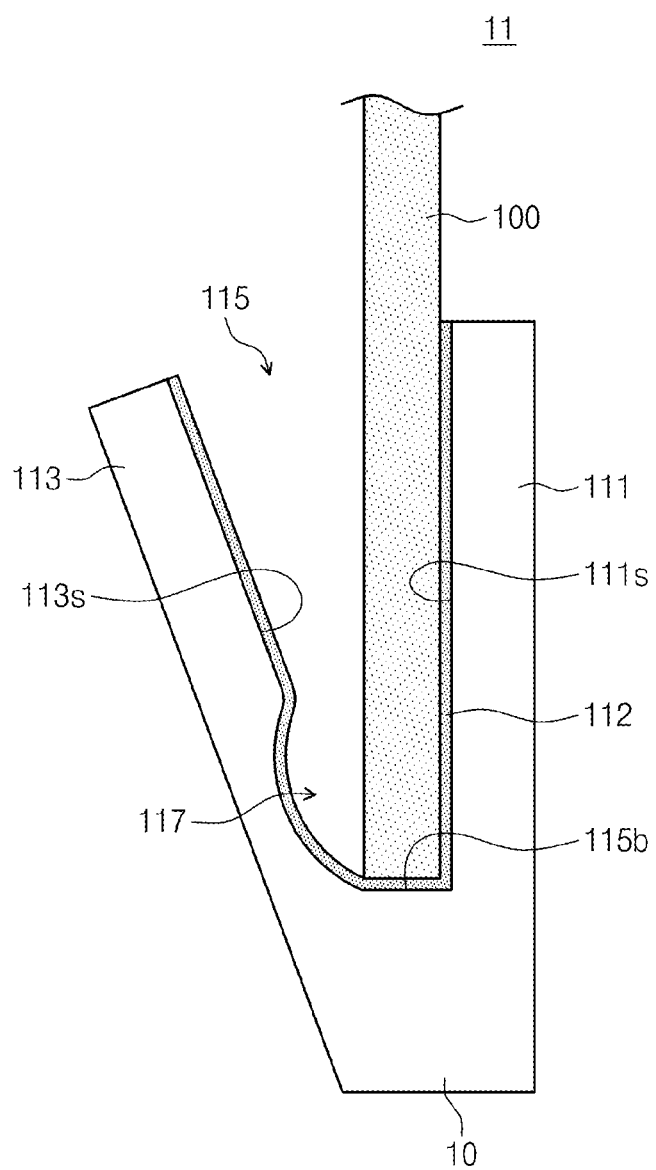

Referring to FIG. 4D, the liner 112 may extend to further cover the second inner side 113s and/or the floor surface 115b of the first groove 115. In such a case, scratches and/or damage to the wafer 100 can be substantially prevented even the wafer 100 contacts the second inner side 113s, such as due to a poor teaching during the insertion of the wafer 100 into the first groove 115.

Figure 4E:
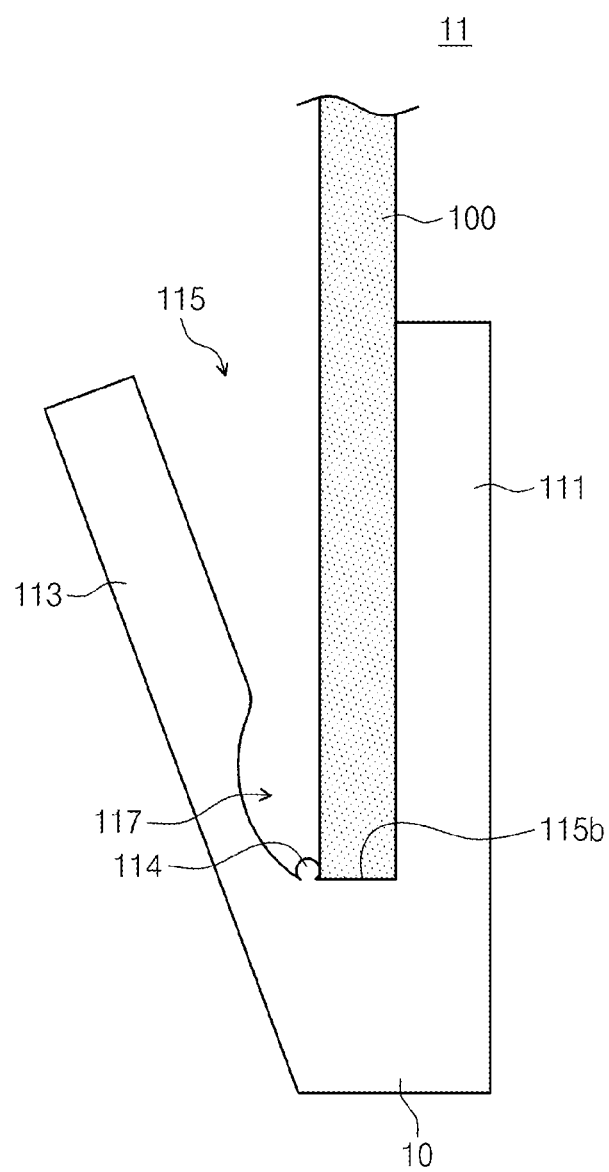

Referring to FIG. 4E, the first loading section 11 may further comprise a fixing member 114 which forms part of the main body 10. The fixing member 114 may, for example, comprise a projection that extends from the floor surface 115b of the first groove 115. The fixing member 114 may extend substantially vertically from the floor surface 115b, or may protrude slantingly toward one of the first and second protrusions 111 and 113. The fixing member 114 may, for instance, comprise a stiff polymer identical or similar to that of the main body 10. In operation, for example, the edge 100e of the wafer 100 may be inserted between the fixing member 114 and the first protrusion 111 such that the first loading section 11 may stably support the wafer 100.

Figure 4F:
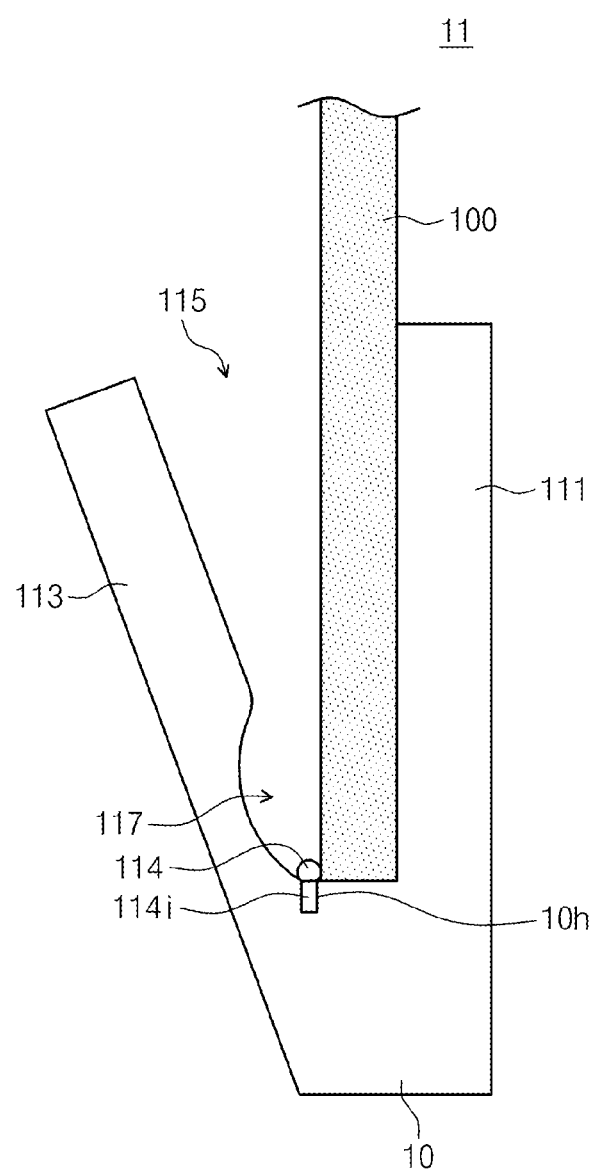

Referring to FIG. 4F, the fixing member 114 may alternatively be removably coupled to the main body 10. For example, the fixing member 114 may have an insertion part 114i which plugs into an insertion hole 10h provided on the floor surface 115b of the first groove 115. The insertion part 114i may, for example, have a wedge shape or a male screw shape.

Figure 4G:
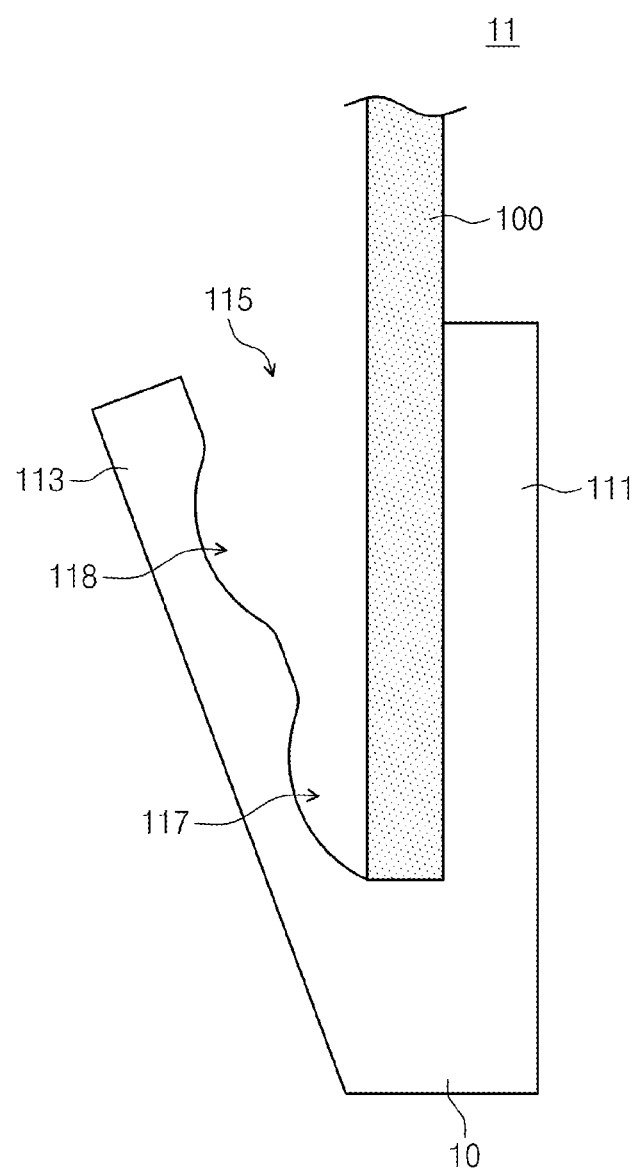

Referring to FIG. 4G, the first loading section 11 may further comprise a second buffer zone 118. For example, the second inner side 113s may be recessed in a second region to define the second buffer zone 118. The second buffer zone 118 may, for instance, be disposed in an upper portion of the second protrusion 113 and may comprise a concave recess to form an oval shape or a hemispherical shape buffer zone 118. When the first groove 115 receives the wafer 100, the wafer 100 may impact against the second protrusion 113 due to a poor teaching. The rounded shape of the second buffer zone 118 may reduce an area of and the adverse effects of an impact between the wafer 100 and the second protrusion 113, even if the wafer 100 collides against the second protrusion 113.

Figure 4H:
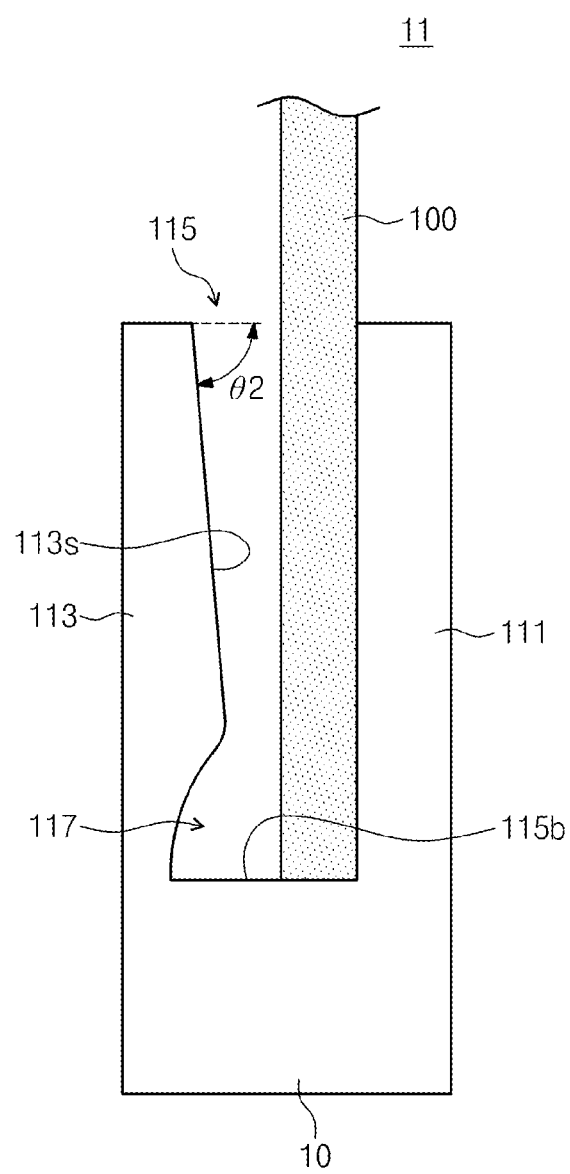

Referring to FIG. 4H, rather than having a substantially V-shaped configuration, the first groove 115 of the first loading section 11 may have a substantially boot-shaped configuration. For example, the first and second protrusions 111 and 113 may substantially vertically protrude from the main body 10, and the second inner side 113s may be inclined to have an upwardly slanting slope. The buffer zone 117 may have a nose-like shape. The first groove 115 may have a lateral width that decreases from the top toward the bottom of the first groove 115, but then increases again nearer the bottom of the first groove 115, close to the body 10, due to the presence of the buffer zone 117. The second inner side 113s may, for instance, have a second tilt angle θ2 that is identical to or less than the first tilt angle θ1 of the first inner side 111s as illustrated in FIG. 4A. Alternatively, the second inner side 113s may have a second tilt angle θ2 of about 90°.

Figure 4I:
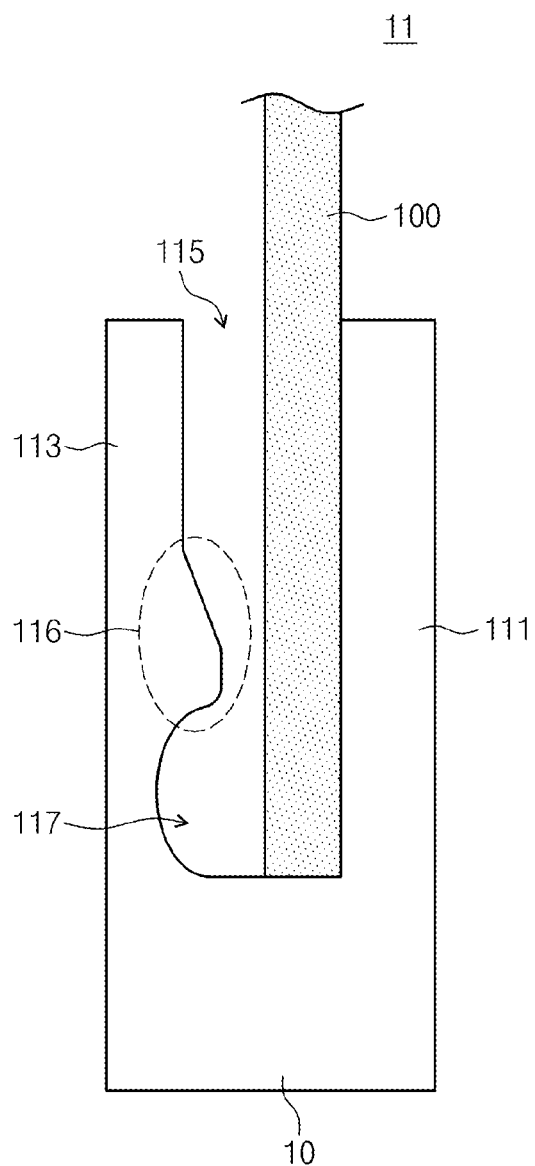

Referring now to FIG. 4I, the first loading section 11 may further comprise a mound or lump 116 which extends outwardly from the second inner side 113s with a substantially convex shape. The mound 116 may, for instance, have a rounded shape. When the first groove 115 receives the wafer 100, the wafer 100 may impact against the second protrusion 113 due to a poor teaching. The rounded shape of the mound 116 may reduce an area of impact between the wafer 100 and the second protrusion 113, even if the wafer 100 collides against the second protrusion 113. In some embodiments, the first and second protrusions 111 and 113 may extend substantially vertically, rather than branching out in the substantially V-shape configuration.

Figure 4J:
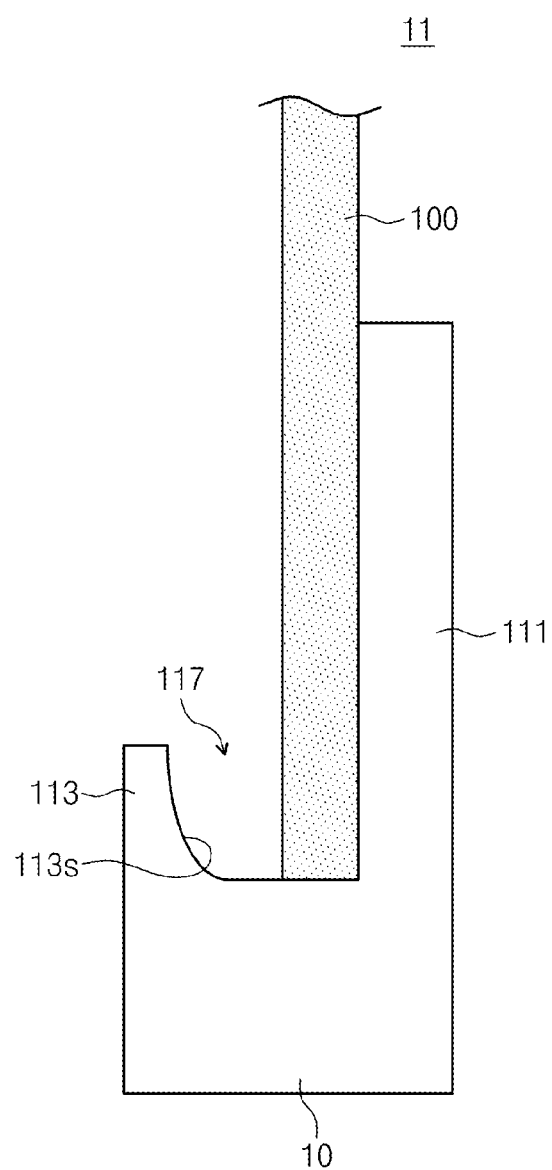

Referring to FIG. 4J, the first loading section 11 may comprise a second protrusion 113 having a vertical length that is less than that of the first protrusion 111. The second inner side 113s may, for example, have a concavely curved slope. The buffer zone 117 may be defined by the concave slope of the second inner side 113s. In some embodiments, the buffer zone 117 may substantially correspond to the first groove 115 of FIG. 2A.

Figure 4K:
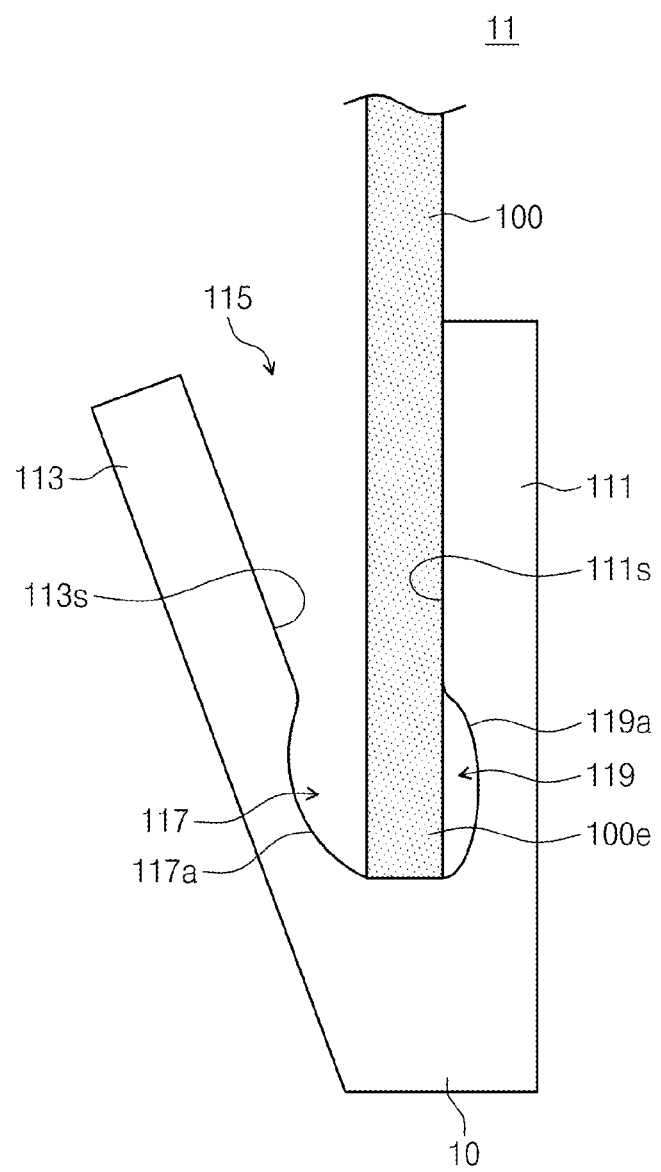

Referring to FIG. 4K, the first loading section 11 may further comprise a third buffer zone 119. For example, the first inner side 111s may also include a concave recess 119a to define the third buffer zone 119. The third buffer zone 119 may be disposed at a lower portion of the first protrusion 111 and have an oval shape or a hemispherical shape. The buffer zone 117 and the third buffer zone 119 may prevent the edge 100e of the wafer 100 from contacted the second and first protrusions 113 and 111, respectively.

The second and/or the third loading sections 12, 13 may be configured to have a structure similar to that of the first loading section 11. For example, the first to third loading sections 11, 12 and 13 may all be configured to have the same one of the configurations illustrated in FIGS. 4A to 4K. Alternatively, however, the first loading section 11 may be configured to have one of the configurations illustrated in FIGS. 4A to 4K, and the second and third loading sections 12 and 13 may be configured to have another of those configurations. In still another embodiment, the first to third loading sections 11, 12 and 13 may each be configured to have a configuration different from the others. For instance, each loading section 11, 12 and 13 may include a different one of the configurations illustrated in FIGS. 4A to 4K.

The first to third loading sections 11, 12 and 13 may each comprise a buffer zone 117, and may further each comprise at least one of the first tilt angle θ1 of FIG. 4A, the vacuum aperture 111h of FIG. 4B, the exhaust aperture 113h of FIG. 4B, the liner 112 of FIG. 4C or 4D, the fixing member 114 of FIG. 4E or 4F, the second buffer zone 118 of FIG. 4G, the second tilt angle θ2 of FIG. 4H, the nose-shaped buffer zone 117 of FIG. 4H, the mound 116 of FIG. 4I, the short second protrusion 113 of FIG. 4J, and/or the third buffer zone 119 of FIG. 4K. Various ones of these possible configurations will be described below in further detail.

FIGS. 5A to 5F are cross-sectional views of wafer loaders according to principles of the inventive concepts, illustrating possible variations to the example embodiment of FIG. 2A. As described above, the wafer 100 may be a single wafer or a bonded wafer, for example.

Figure 5A:
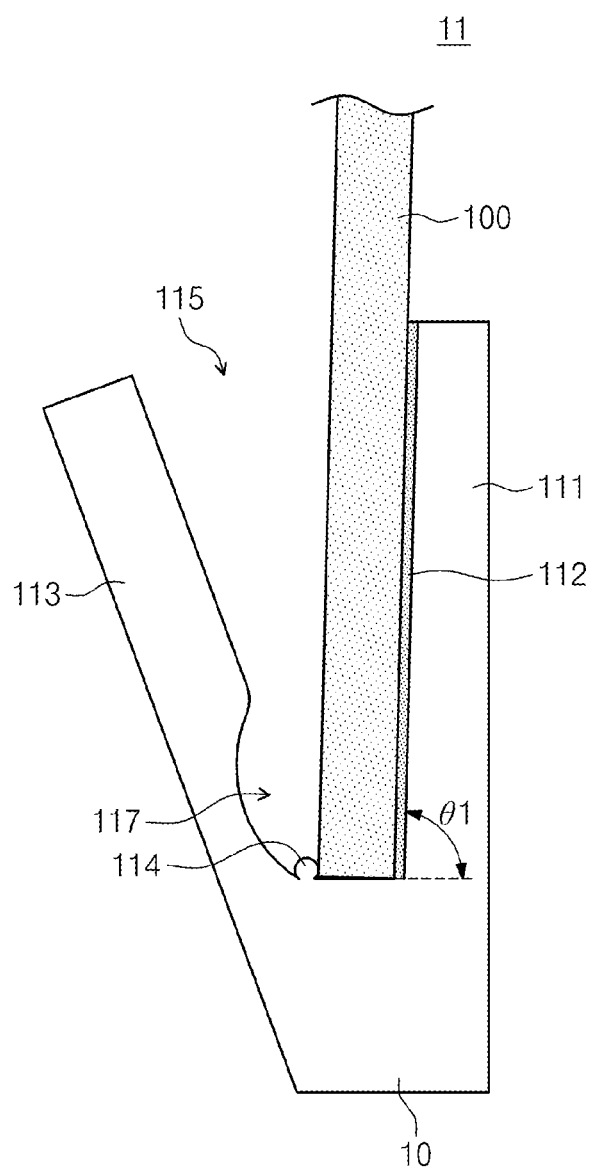
FIGS. 5A to 5F are cross-sectional views of a wafer loader according to principles of the present inventive concepts, illustrating various additional possible modifications to the embodiment of FIG. 2A.

Referring to FIG. 5A, the first loading section 11 may comprise a buffer zone 117 and may further comprise a first protrusion 111 having the first tilt angle θ1, such that a wafer 100 may be slantingly loaded therein. A fixing member 114 may also be provided to firmly secure the wafer 100, and a liner 112 may be arranged along the inner wall of the first protrusion 111 to reduce friction between the wafer 100 and the first protrusion 111. The fixing member 114 may, for instance, be a part of the main body 10.

Figure 5B:
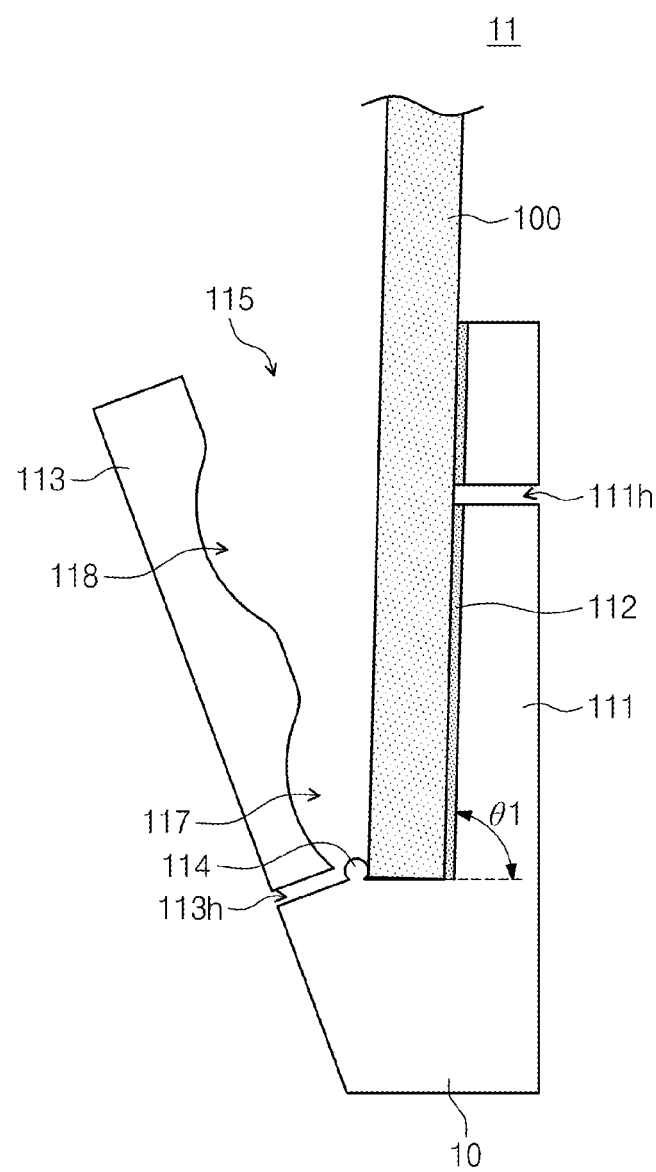

Referring to FIG. 5B, the first loading section 11 may comprise a buffer zone 117 and a second buffer zone 118 disposed above the first buffer zone 117. A vacuum aperture 111h may also be provided to holds the wafer 100 against the first protrusion 111, along with an exhaust aperture 113h that discharges a liquid material from the wafer 100. Moreover, the first loading section 11 may comprise the first protrusion 111 arranged at a first tilt angle θ1, such that the wafer 100 may be slantingly loaded. A fixing member 114 may be included to secure the wafer 100, and a liner 112 may be provided to reduce friction between the wafer 100 and the first protrusion 111. The vacuum aperture 111h may penetrate the liner 112 as well as the first protrusion 111.

Figure 5C:
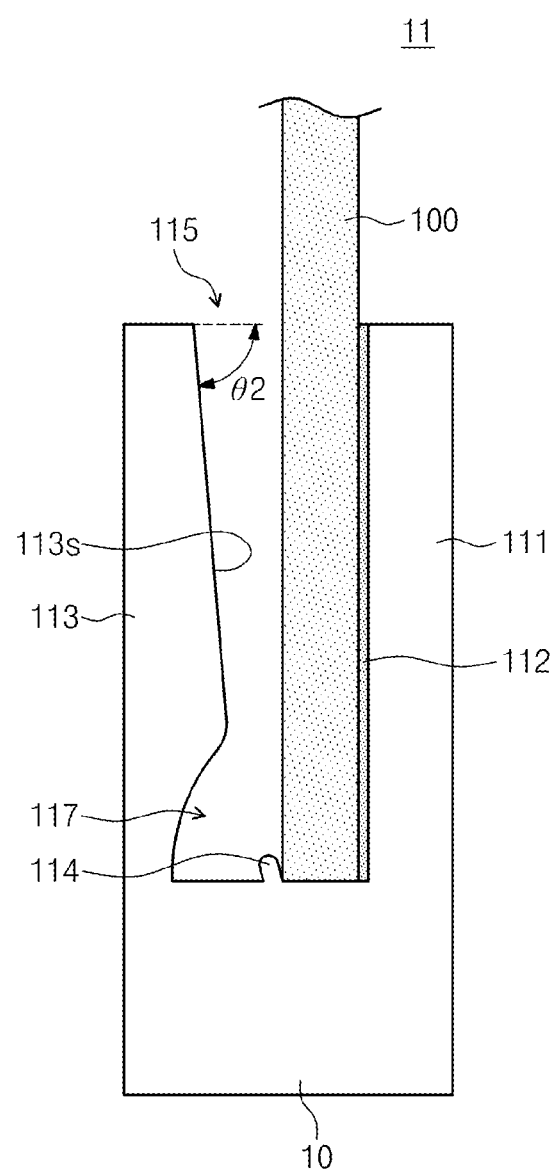

Referring to FIG. 5C, the first loading section 11 may comprise a buffer zone 117 and a fixing member 114 that is a part of the main body 10. A liner 112 may be provided to reduce friction between the wafer 100 and the first protrusion 111. The buffer zone 117 may have a nose-like shape, and the second inner side 113s may be inclined at a second tilt angle θ2 such that the first groove 115 may have a boot-like shape with a relatively wide entrance. The fixing member 114 may have a projecting shape that leans toward the second protrusion 113.

Figure 5D:
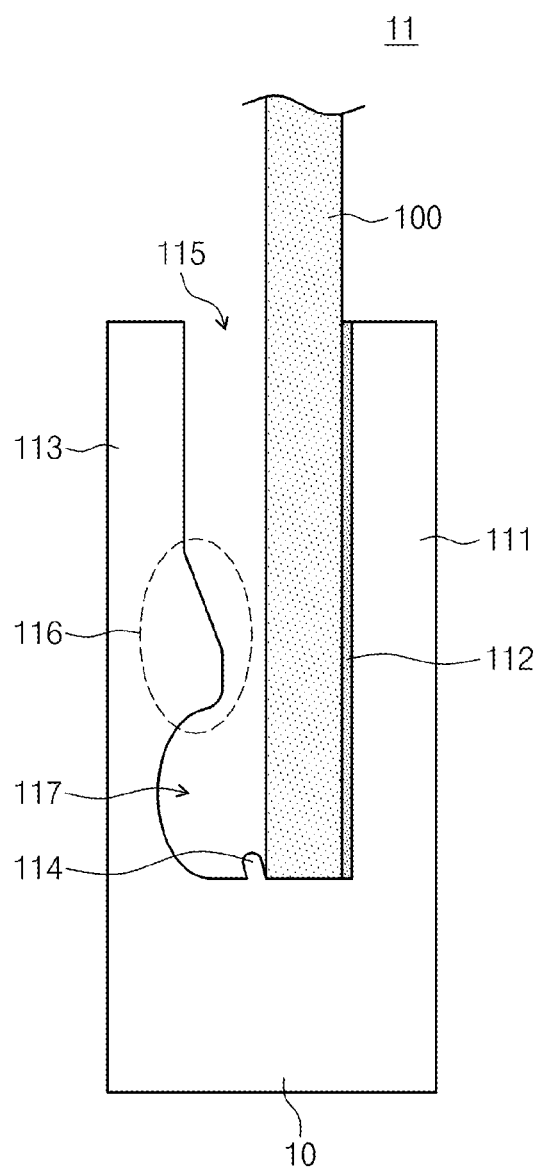

Referring to FIG. 5D, the first loading section 11 may comprise a buffer zone 117 and a fixing member 114 that is a part of the main body 10. A liner 112 may be included to reduce friction between the wafer 100 and the first protrusion 111. A convex mound 116 may extend outwardly from the second inner side 113s. The fixing member 114 may have a projecting shape that leans toward the second protrusion 113.

Figure 5E:
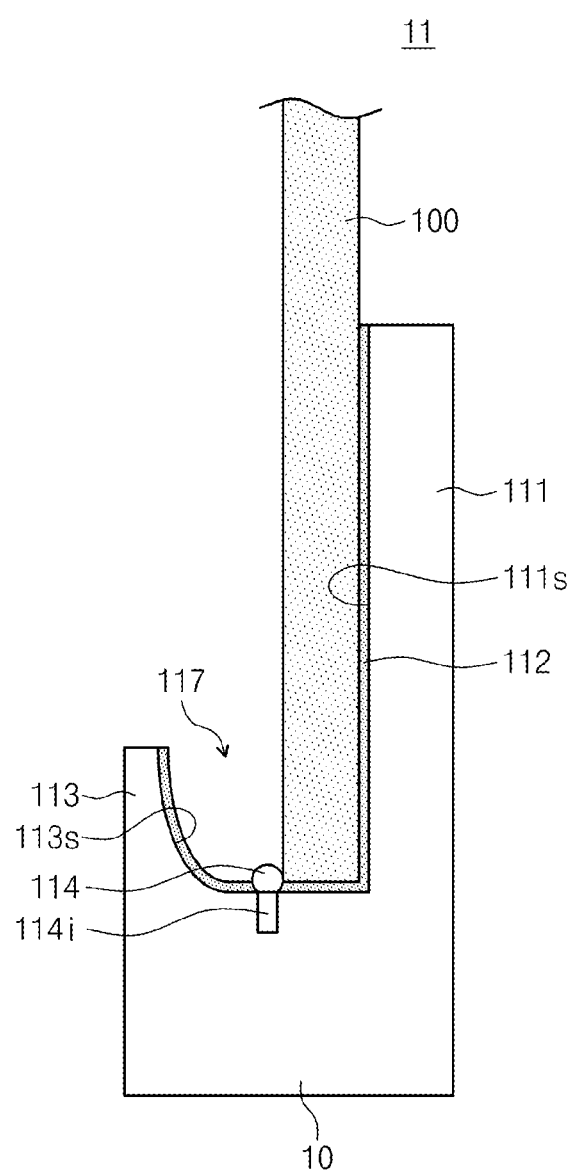

Referring to FIG. 5E, the first loading section 11 may comprise a buffer zone 117. A liner 112 may be provided to reduce the friction between the wafer 100 and the first protrusion 111. A fixing member 114 may also be included to secure the wafer 100. The liner 112 may continuously extend along the second inner side 113s from along the first inner side 111s. The fixing member 114 may be removably coupled to the main body 10 by an insertion part 114i having a male screw shape.

Figure 5F:
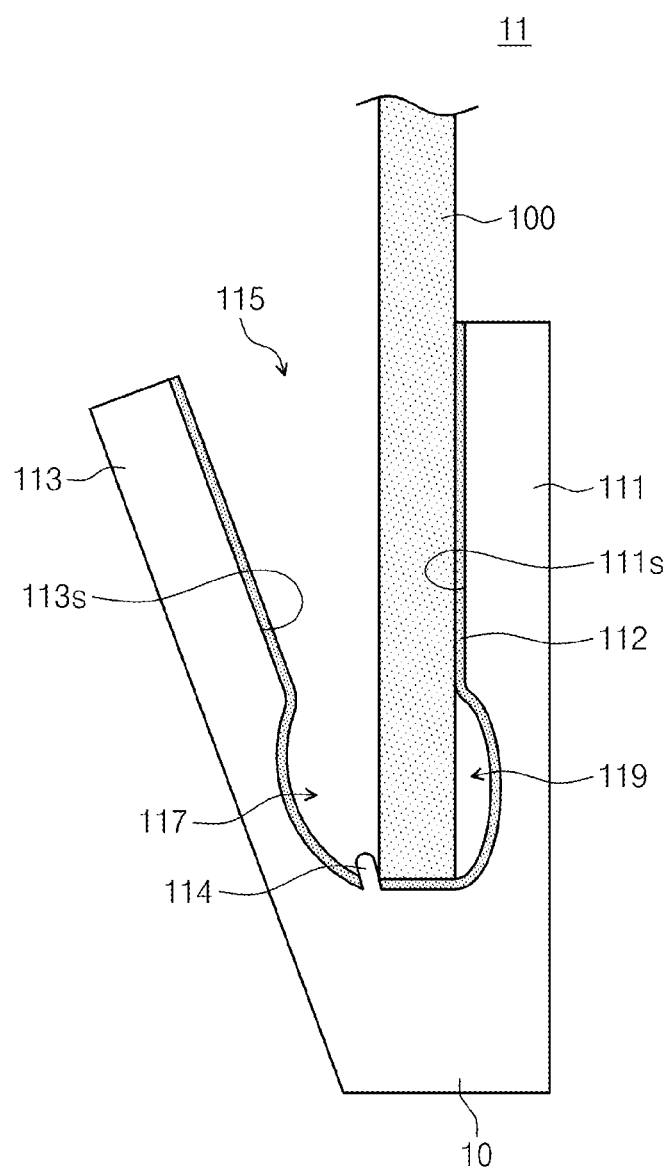

Referring to FIG. 5F, the first loading section 11 may comprise a buffer zone 117 arranged at a lower part of a second protrusion 113 and a third buffer zone 119 at the lower part of the first protrusion 111. A liner 112 may be provided which extends along first and second inner sides 111s, 113s. A fixing member 114 may be provided as part of the main body 10 and may have a projecting shape that leans toward the second protrusion 113.

The descriptions provided with reference to FIGS. 5A to 5F may also be applicable to the second and third loadings sections 12 and 13. For example, the first to third loading sections 11, 12 and 13 may each be configured to have the same one of the configurations of FIGS. 5A to 5F. Alternatively, the first loading section 11 may be configured to have one of the configurations as illustrated in FIGS. 5A to 5F, and the second and third loading sections 12 and 13 may be configured to have another of the configurations as illustrated in FIGS. 5A to 5F. Otherwise, the first to third loading sections 11, 12 and 13 may each be configured to have a different one of the configurations illustrated in FIGS. 5A to 5F.

Figure 6:
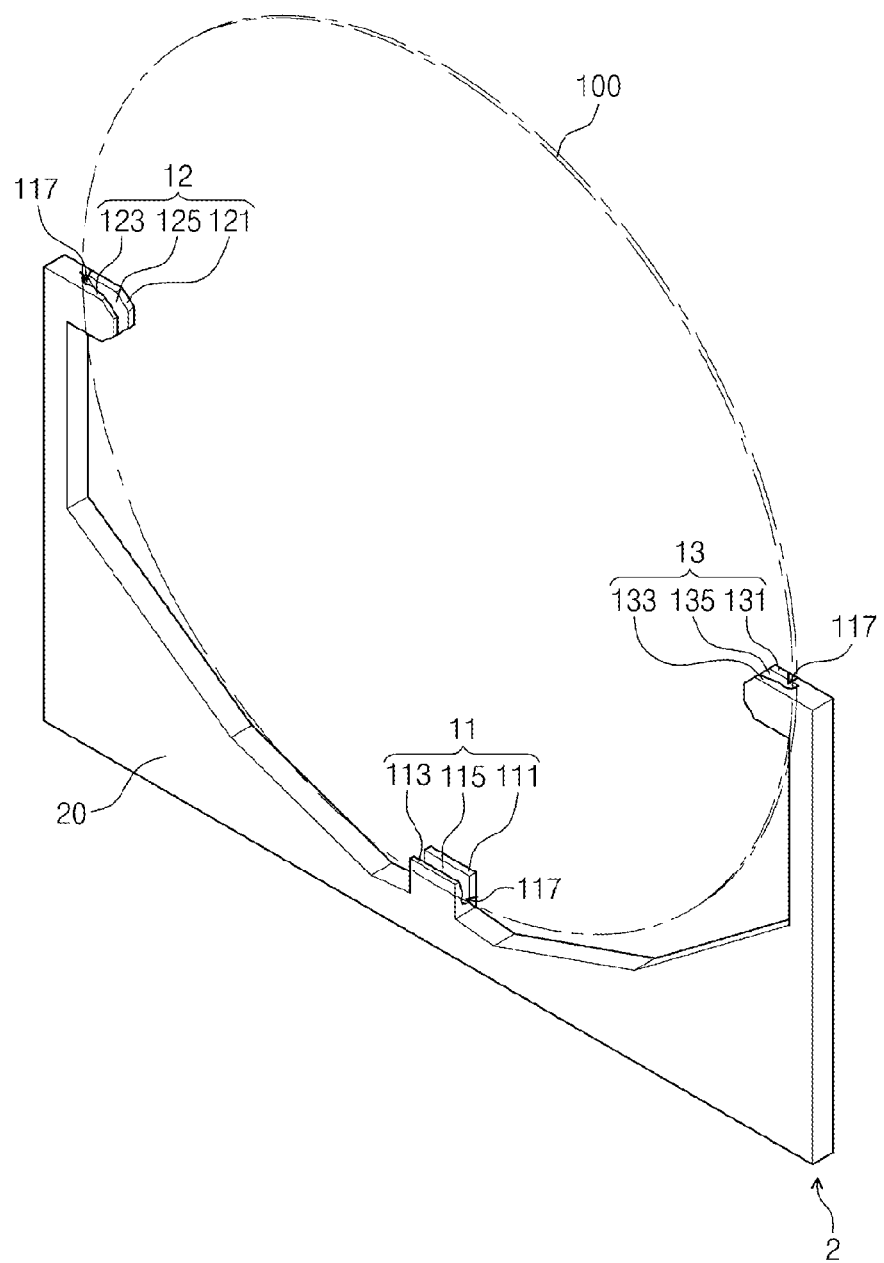
FIG. 6 is a perspective view of a wafer loader according to another exemplary embodiment of the present inventive concepts.

FIG. 6 is a perspective view illustrating a wafer loader according to another exemplary embodiment of the present inventive concepts.

Referring to FIG. 6, a second wafer loader 2 according to this embodiment may comprise a main body 20. First to third loading sections 11, 12 and 13 that protrude from the main body 20 may also be provided. The first loading section 11 may comprise two protrusions 111 and 113 that branch out in a substantially V-shape to form a first groove 115. Similarly, the second loading section 12 may comprise two protrusions 121 and 123 that branch out in a substantially V-shape to form a second groove 125. Likewise, the third loading section 13 may comprise two protrusions 131 and 133 that branch out in a substantially V-shape to form a third groove 135.

The loading sections 11 to 13 may be arranged to contact an edge of the wafer 100. For example, the first loading section 11 may be provided to receive a wafer 100 at a 6 o'clock position of the wafer 100, the second loading section 12 may be disposed at a 9 o'clock position of the wafer 100, and a third loading section 13 may be located at a 3 o'clock position of the wafer 100.

The second wafer loader 2 may, for instance, load the wafer 100 vertically or horizontally. By having the second loading section 12 and the third loading section 13 arranged at the 9 o'clock and the 3 o'clock positions of the wafer 100, respectively, the second wafer loader 2 may stably load the wafer 100 in a horizontal state as well as a vertical state.

The previous descriptions regarding the construction and various possible configurations of the first wafer loader 1 shown in FIGS. 1 to 5F are also applicable to the second wafer loader 2 of this embodiment. Accordingly, redundant descriptions thereof with respect to this embodiment will be omitted.

Figure 7A:
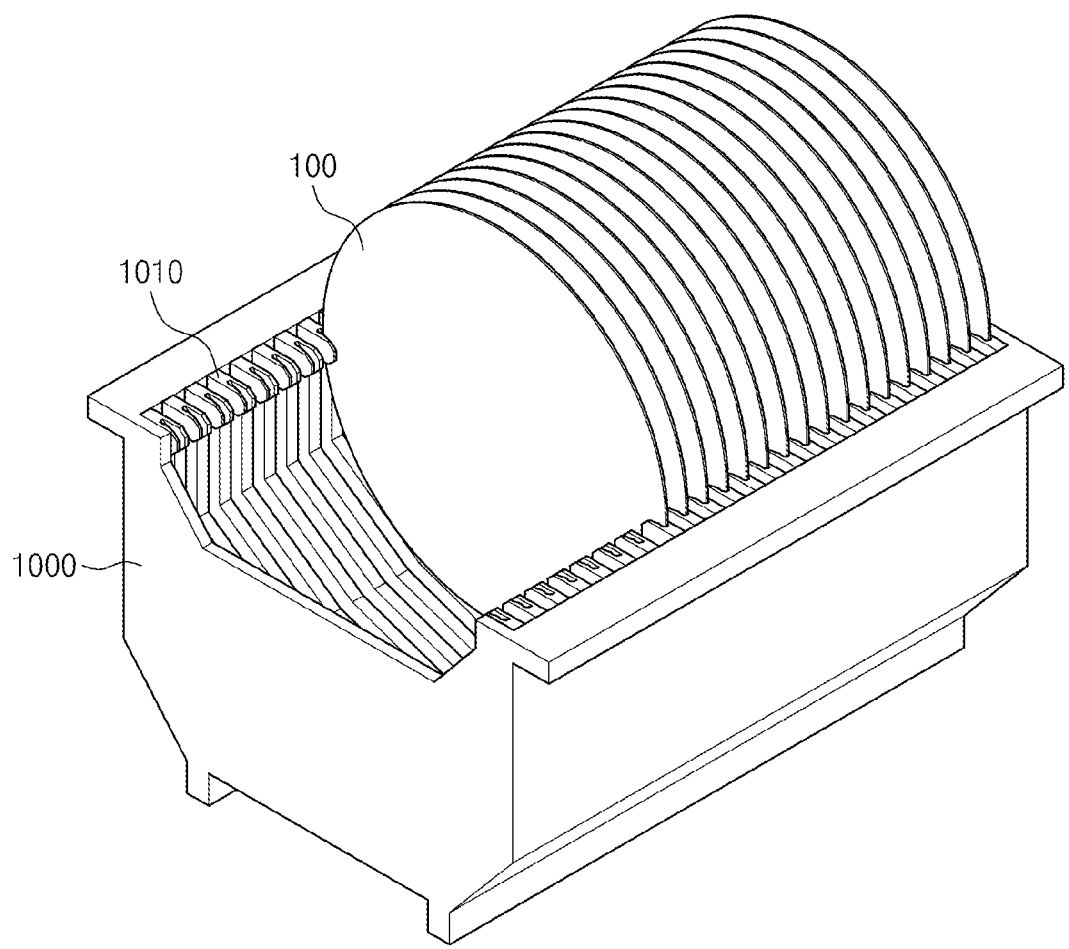
FIG. 7A is a perspective view of a wafer cassette having a plurality of wafer loaders therein according to an exemplary embodiment of the present inventive concepts.
Figure 7B:
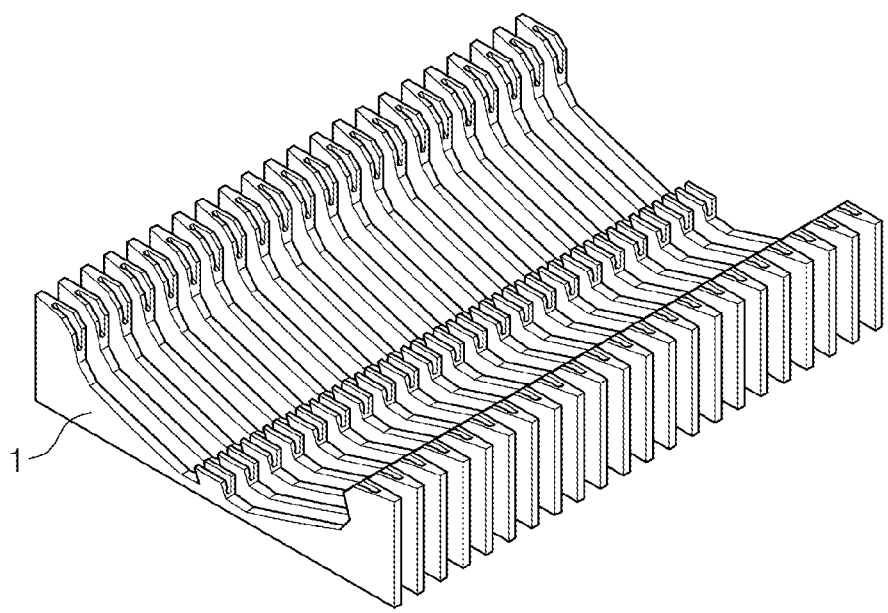
FIGS. 7B and 7C are perspective views illustrating the plurality of wafer loaders that may be arranged in a wafer cassette according to exemplary embodiments of the present inventive concepts.
Figure 7C:
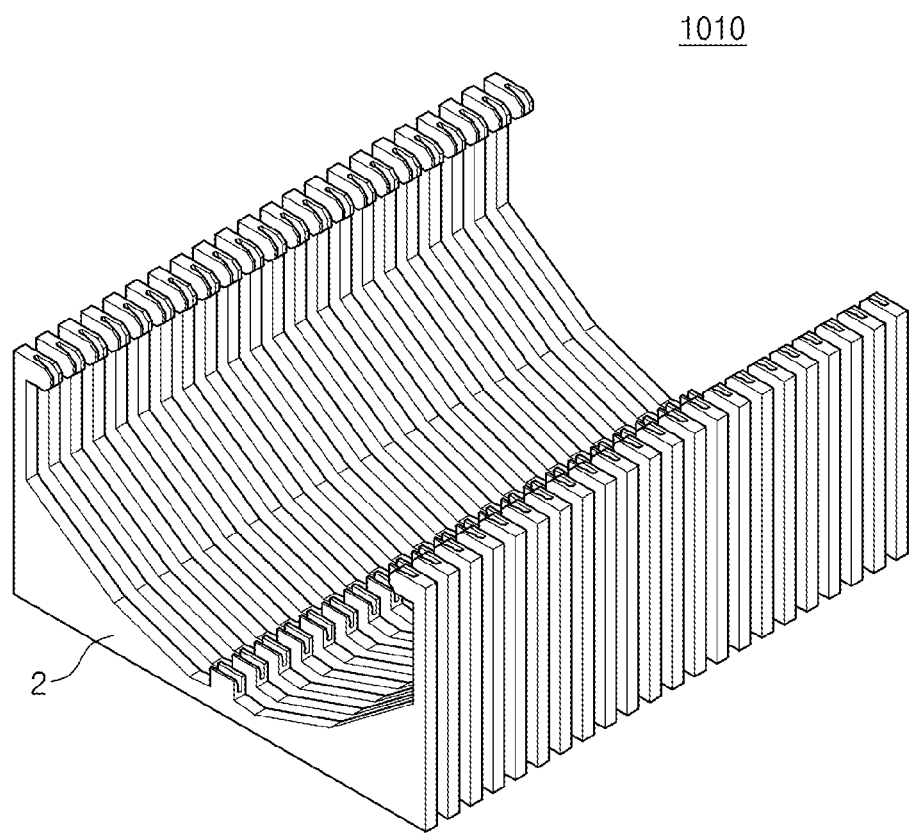

FIG. 7A is a perspective view of a wafer cassette having a plurality of wafer loaders arranged therein according to an exemplary embodiment of the present inventive concepts. FIGS. 7B and 7C are perspective views of different configurations of the wafer loaders that may be arranged in the wafer cassette of FIG. 7A.

Referring now to FIG. 7A, a wafer cassette 1000 may comprise a tray 1010 having plurality of slots that receive the plurality of single or bonded wafers 100. The tray 1010 may be provided by a plurality of the first wafer loaders 1 or a plurality of the second wafer loaders 2.

For example, as illustrated in FIG. 7B, the tray 1010 may comprise a plurality of the first wafer loaders 1 that are horizontally arranged at regular intervals or directly adjacent each other. Alternatively, as illustrated in FIG. 7C, the tray 1010 may comprise a plurality of the second wafer loaders 2 that are horizontally arranged at regular intervals or directly adjacent each other. In some embodiments, the tray 1010 of the wafer cassette 100 may comprise the second wafer loaders 2, which are configured to receive left and right edges of the wafer 100.

Figure 8A:
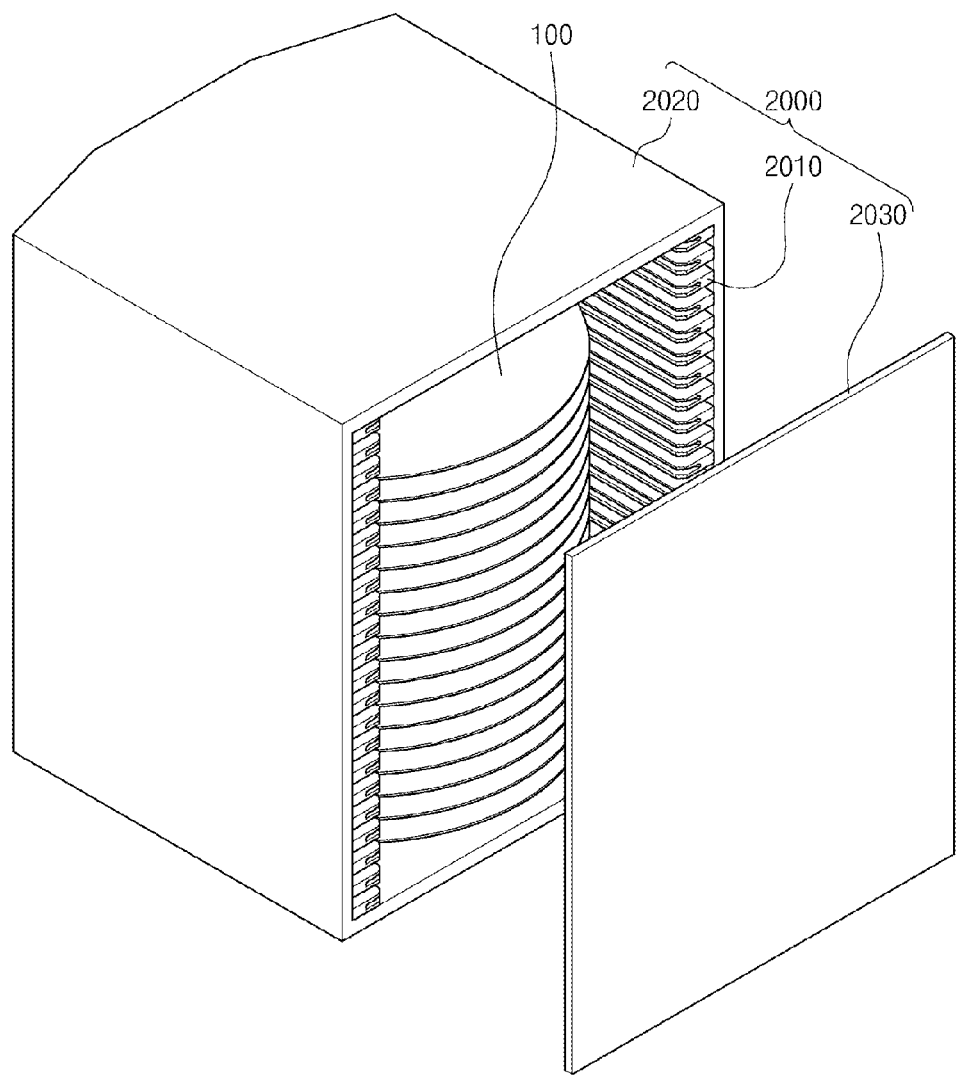
FIG. 8A is a perspective view of a wafer carrier box having a plurality of wafer loaders arranged therein according to an exemplary embodiment of the present inventive concepts.
Figure 8B:
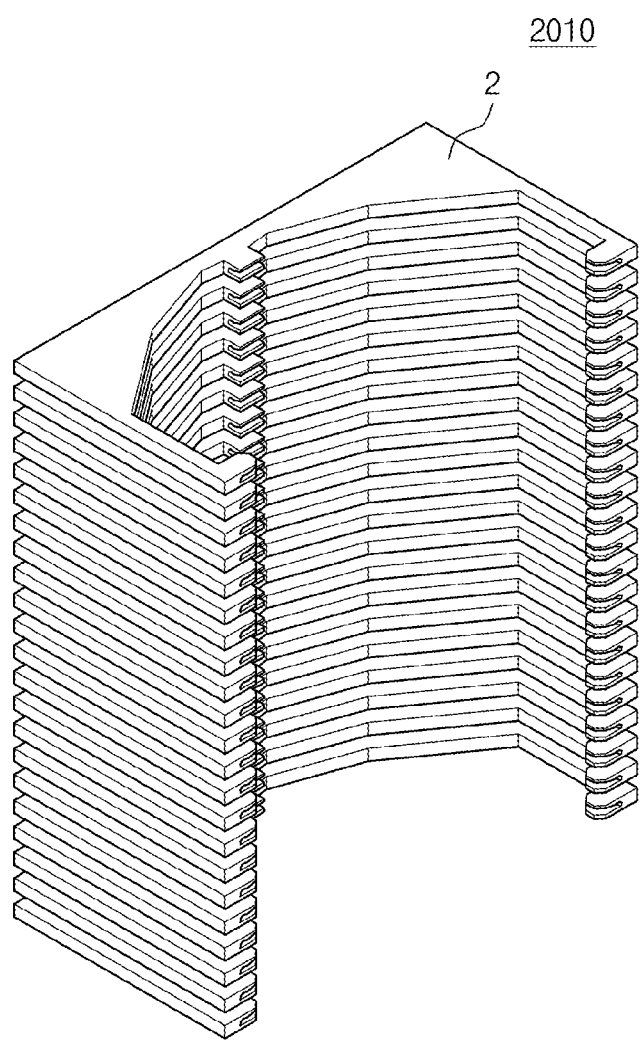
FIG. 8B is a perspective view of the wafer loaders arranged in the wafer carrier box of FIG. 8A according to an exemplary embodiment of the present inventive concepts.

FIG. 8A is a perspective view of a wafer carrier box having a plurality of wafer loaders arranged therein according to an exemplary embodiment of the present inventive concepts. FIG. 8B is a perspective view illustrating wafer loaders configured to be arranged in a wafer carrier box according to an exemplary embodiment of the present inventive concepts.

Referring to FIG. 8A, a wafer carrier box 200 such as FOUP (front opening unified pod) or FOSB (front opening shipping box) may comprise a box 2020 including a tray 2010 having slots into which the single or bonded wafers 100 are loaded, and a door 2030 capable of hermetically closing the box 2020. The tray 2010 may, for example, comprise a plurality of the first wafer loaders 1 or a plurality of the second wafer loaders 2.

As illustrated in FIG. 8B, the tray 2010 may comprise a plurality of the second wafer loaders 2 vertically arranged at regular intervals or directly adjacent each other.

The wafer loaders 1 and 2 may be utilized, for instance, in any wafer loading equipment, such as a wafer transfer apparatus or a wafer loading apparatus, as well as in the wafer cassette 1000 and the wafer carrier box 2000 shown and described.

As described above, a wafer loader constructed according to principles of the inventive concepts includes a buffer zone to permit loading of a wafer without damage and impact thereto that might otherwise result from physical contact between an edge of the wafer and the wafer loader. Moreover, the wafer loader may further include a liner and/or a fixing member to reduce friction between the wafer and the loader and/or securely support the wafer, respectively. A wafer loader having the buffer zone can further safely handle a wafer attached to a carrier. Consequently, the wafer loader of the present inventive concepts can improve yield by reducing damage and impact to the wafer, can decrease process costs by preventing production of inferior wafers, and can eliminate additional processes that may otherwise be required due to broken or defective wafers.

Although the present inventive concepts have been described in connection with various exemplary embodiments illustrated in the accompanying drawings, the inventive concepts are not limited thereto. It will be apparent to those skilled in the art that various substitution, modifications and changes may be thereto without departing from the scope and spirit of the inventive concepts.

What is claimed is:

1. A wafer loader comprising:
   a wafer;
   a plurality of loading sections that protrude from a main body and are configured to be arranged along and support an edge of the wafer, wherein each of the loading sections has a groove into which the edge of the wafer may be inserted,
   wherein at least one of the loading sections comprises first and second protrusions having first and second inner sides, respectively, said first and second inner sides facing each other to define the groove, the first protrusion comprising a predetermined length and the second protrusion comprising a predetermined length that is substantially equal to the predetermined length of the first protrusion, one of the first or second inner sides comprising a first surface to contact a surface of the wafer, the first surface comprising the predetermined length, and the other of the first and second inner sides comprising a second surface comprising the predetermined length, wherein the first surface protrudes substantially vertically from the main body and the second surface protrudes from the main body at a slant, wherein the second surface is recessed to define a buffer zone on the second surface, the buffer zone extending the predetermined length of the second surface, and wherein a bottom edge surface of the wafer is configured to contact a floor surface of the groove having a shape that coincides with the bottom edge surface of the wafer.

2. The wafer loader of claim 1, wherein the buffer zone has a substantially concave shape.

3. The wafer loader of claim 1, wherein the second surface extends away from the main body at a slant.

4. The wafer loader of claim 1, wherein the groove has a lateral width that decreases with decreasing distance from the main body.

5. A wafer loader comprising:
a wafer;
a main body; and
first and second protrusions extending away from the main body to define a groove to receive the wafer, the first protrusion comprising a predetermined length and the second protraction comprising a predetermined length that is substantially equal to the predetermined length of the first protrusion, the first and second protrusions including first and second inner sides, respectively, said first and second inner sides facing each other and extending substantially the predetermined length, wherein the first inner side of the first protrusion is configured to contact one surface of a wafer loaded into the wafer loader, and wherein the second inner side of the second protrusion is recessed to define a first buffer zone to keep an opposite surface of the wafer spaced apart from the second inner side of the second protrusion, the first buffer zone extending the predetermined length of the second inner side of the second protrusion, wherein a bottom edge surface of the wafer is configured to contact a floor surface of the groove having a shape that coincides with the bottom edge surface of the wafer, wherein the first protrusion protrudes substantially vertically from the main body and wherein the second protrusion protrudes from the main body at an inclined angle, and wherein the groove has a lateral width that increases with a distance from the main body.

6. The wafer loader of claim 5, wherein the first and second protrusions provide a loading section configured to receive an edge of the wafer, and wherein the wafer loader comprises a plurality of loading sections arranged at various locations that correspond to locations along the edge of the wafer.

* * * * *